(12) United States Patent
Krasner et al.

(10) Patent No.: US 12,111,791 B2
(45) Date of Patent: Oct. 8, 2024

(54) USING MACHINE LEARNING TO SELECT COMPRESSION ALGORITHMS FOR COMPRESSING BINARY DATASETS

(71) Applicant: EMC IP HOLDING COMPANY LLC, Hopkinton, MA (US)

(72) Inventors: John Krasner, Coventry, RI (US); Sweetesh Singh, Benares (IN)

(73) Assignee: DELL PRODUCTS, L.P., Hopkinton, MA (US)

( * ) Notice: Subject to any disclaimer, the term of this patent is extended or adjusted under 35 U.S.C. 154(b) by 946 days.

(21) Appl. No.: 17/113,237

(22) Filed: Dec. 7, 2020

(65) Prior Publication Data

US 2022/0179829 A1    Jun. 9, 2022

(51) Int. Cl.
*G06F 16/174*    (2019.01)
*G06N 5/04*    (2023.01)
*G06N 20/00*    (2019.01)

(52) U.S. Cl.
CPC ......... *G06F 16/1744* (2019.01); *G06N 5/04* (2013.01); *G06N 20/00* (2019.01)

(58) Field of Classification Search
CPC ....... G06N 5/04; G06N 20/00; G06F 16/1744
See application file for complete search history.

(56) References Cited

U.S. PATENT DOCUMENTS

| 10,664,165 B1* | 5/2020 | Faibish | G06F 3/0638 |
| 2020/0128307 A1* | 4/2020 | Li | H04N 19/119 |
| 2021/0273649 A1* | 9/2021 | Li | H03M 7/40 |

\* cited by examiner

*Primary Examiner* — Tasnima Matin
(74) *Attorney, Agent, or Firm* — Anderson Gorecki LLP

(57) ABSTRACT

A data model is trained to predict compressibility of binary data structures based on component entropy and predict relative compression efficiency for various compression algorithms based on component size. A recommendation engine in a storage system uses the data model to predict compressibility of binary data and determines whether to compress the binary data based on predicted compressibility. If the recommendation engine determines that compression of the binary data is justified, then a compression algorithm is recommended based on predicted relative compression efficiency. For example, the compression algorithm predicted to yield the greatest compression ratio or shortest compression/decompression time may be recommended.

20 Claims, 5 Drawing Sheets

USING MACHINE LEARNING TO SELECT COMPRESSION ALGORITHMS FOR COMPRESSING BINARY DATASETS

TECHNICAL FIELD

The subject matter of this disclosure is generally related to data storage systems, and more particularly to data compression.

BACKGROUND

Storage Area Networks (SANs) and Network-Attached Storage (NAS) are examples of data storage systems that are used to maintain large datasets. Such storage systems often simultaneously support multiple host servers and multiple host applications. Data replication, backup, protection, and a variety of other storage-related functions are implemented by the storage systems help to avoid data loss and maintain data availability but tend to increase storage space requirements. Compression can help to reduce storage space requirements, but the compressibility of individual blocks or files with specific compression algorithms is difficult to accurately predict so compression may be implemented inefficiently, and processor cycles may be wasted on compression of data that is poorly compressible.

SUMMARY

An apparatus in accordance with some of the inventive aspects comprises: at least one compute node that manages access to non-volatile storage, the compute node configured to respond to commands from host nodes to access host application data stored on the non-volatile storage, wherein the host application data comprises binary data; a data model that has been trained to predict compression efficiency of binary data structures by a plurality of data compression algorithms based on binary data structure component size; and a recommendation engine that uses the data model to determine which one of the plurality of data compression algorithms will most efficiently compress selected binary data and recommends that compression algorithm; wherein the compute node compresses the selected binary data using the recommended compression algorithm.

A method in accordance with some of the inventive aspects comprises: in a storage system comprising at least one compute node that manages access to non-volatile storage, the compute node configured to respond to commands from host nodes to access host application data stored on the non-volatile storage, wherein the host application data comprises binary data: predicting compression efficiency of selected binary data by a plurality of compression algorithms using a data model that has been trained to predict compression efficiency of binary data structures with the data compression algorithms based on binary data structure component size; and based on predicted compressibility, selecting one of the plurality of data compression algorithms that will most efficiently compress the selected binary data; recommending the selected compression algorithm; and compressing the selected binary data using the recommended compression algorithm.

A computer-readable storage medium stores instructions that when executed by a compute node cause a storage system to perform a method for data compression, the method comprising: predicting compression efficiency of selected binary data by a plurality of compression algorithms using a data model that has been trained to predict compression efficiency of binary data structures by the data compression algorithms based on binary data structure component size; and based on predicted compression efficiency, selecting one of the plurality of data compression algorithms that will most efficiently compress the selected binary data; recommending the selected compression algorithm; and compressing the selected binary data using the recommended compression algorithm.

Other aspects, features, and implementations may become apparent in view of the detailed description and figures. All examples, aspects, and features mentioned in this document can be combined in any technically possible way.

DETAILED DESCRIPTION

The terminology used in this disclosure is intended to be interpreted broadly within the limits of subject matter eligibility. The terms "logical" and "virtual" are used to refer to features that are abstractions of other features, e.g. and without limitation abstractions of tangible features. The term "physical" is used to refer to tangible features that possibly include, but are not limited to, electronic hardware. For example, multiple virtual computers could operate simultaneously on one physical computer. The term "logic" is used to refer to special-purpose physical circuit elements, firmware, software, computer instructions that are stored on a non-transitory computer-readable medium and implemented by multi-purpose tangible processors, and any combinations thereof.

Some aspects, features, and implementations described herein may include machines such as computers, electronic components, optical components, and processes such as computer-implemented procedures and steps. It will be apparent to those of ordinary skill in the art that the computer-implemented procedures and steps may be stored as computer-executable instructions on a non-transitory computer-readable medium. Furthermore, it will be understood by those of ordinary skill in the art that the computer-executable instructions may be executed on a variety of tangible processor devices, i.e. physical hardware. For practical reasons, not every step, device, and component that may be part of a computer or data storage system is described herein. Those of ordinary skill in the art will recognize such steps, devices, and components in view of the teachings of the present disclosure and the knowledge generally available to those of ordinary skill in the art. The corresponding machines and processes are therefore enabled and within the scope of the disclosure.

Figure 1:
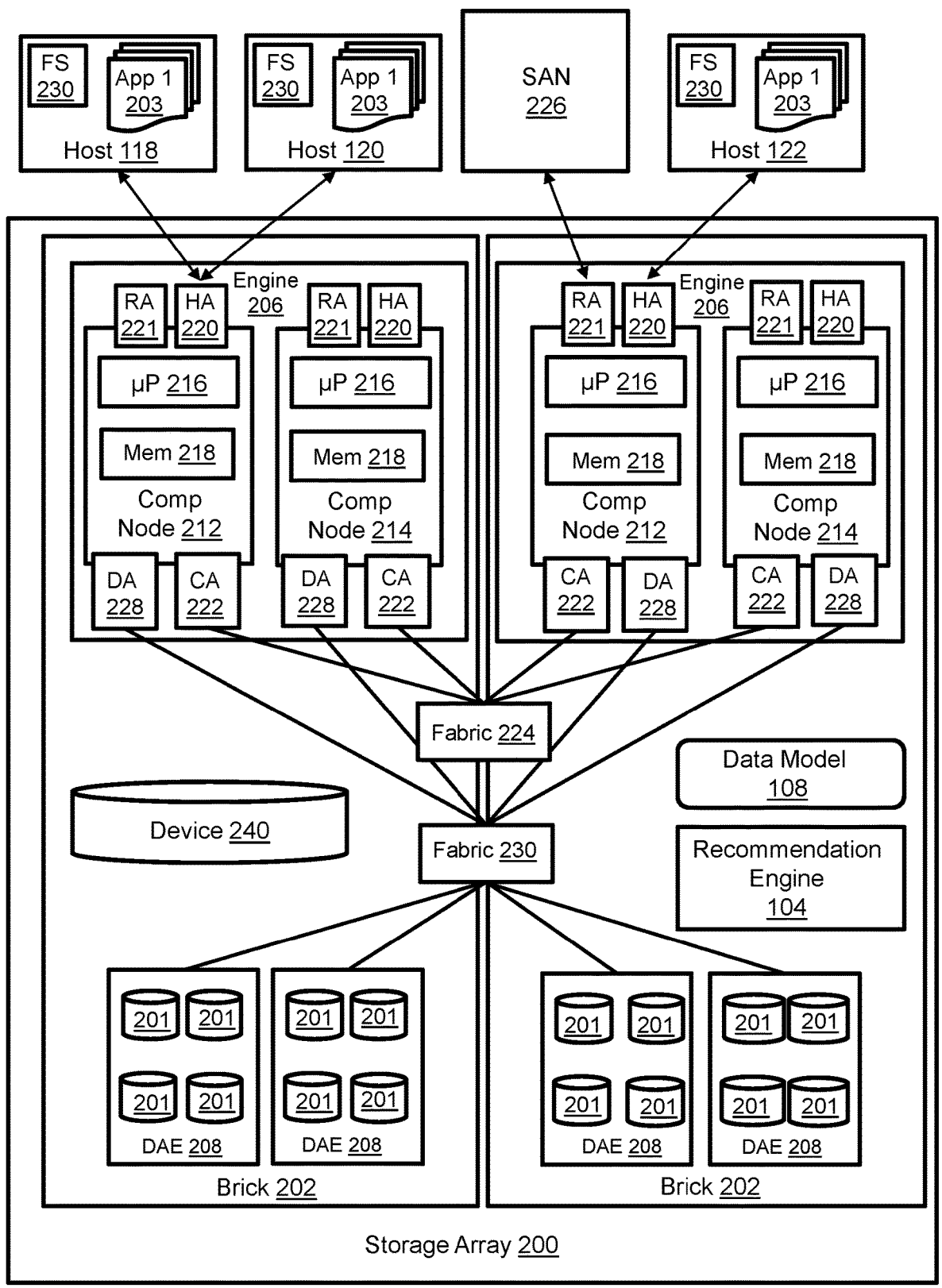
FIG. 1 illustrates a storage array with a recommendation engine that uses a data model to determine whether to compress blocks of binary data and to select compression algorithms to use with blocks of binary data that are compressed.

FIG. 1 illustrates a storage array 200 with a recommendation engine 104 that uses a data model 108 to determine whether to compress blocks of binary data and to select compression algorithms to use with blocks of binary data that are compressed. The data model and recommendation engine can predict compressibility in general and relative compressibility by different compression algorithms using fewer processor cycles and less memory than would be required to perform compression with different compression algorithms, thereby improving the functioning of the storage array.

A storage array is one possible implementation of a SAN. The illustrated storage array includes one or more bricks 202. Each brick 202 includes an engine 206 and one or more drive array enclosures (DAEs) 208. Each engine 206 includes a pair of interconnected compute nodes 212, 214 that are arranged in a failover relationship and may be referred to as "storage directors." Although it is known in the art to refer to the compute nodes of a SAN as "hosts," that naming convention is avoided in this disclosure to help avoid confusion with the hosts 118, 120, 122 that run host application instances 203 from the compute nodes 212, 214. Nevertheless, the host applications could run on the compute nodes. Each compute node includes resources such as at least one multi-core processor 216 and local memory 218. The processor 216 may include central processing units (CPUs), graphics processing units (GPUs), or both. The local memory 218 may include volatile media such as dynamic random-access memory (DRAM), non-volatile memory (NVM) such as storage-class memory (SCM), or both. Each compute node includes one or more host adapters (HAs) 220 for communicating with the hosts. Each host adapter has resources for receiving and responding to input-output commands (IOs) from the hosts. The host adapter resources may include processors, volatile memory, and ports via which the hosts may access the storage array. Each compute node also includes a remote adapter (RA) 221 for communicating with other storage systems such as a SAN 226 on which a production volume replica is maintained. Each compute node also includes one or more drive adapters (DAs) 228 for communicating with managed drives 201 in the DAEs 208. Each drive adapter has processors, volatile memory, and ports via which the compute node may access the DAEs for servicing IOs. Each compute node may also include one or more channel adapters (CAs) 222 for communicating with other compute nodes via an interconnecting fabric 224. The managed drives 201 include non-volatile storage media such as, without limitation, solid-state drives (SSDs) based on EEPROM technology such as NAND and NOR flash memory and hard disk drives (HDDs) with spinning disk magnetic storage media. Drive controllers may be associated with the managed drives as is known in the art. An interconnecting fabric 230 enables the implementation of an N-way active-active backend. A backend connection group includes all drive adapters that can access the same drive or drives. In some implementations, every drive adapter 228 in the storage array can reach every DAE via the fabric 230. Further, in some implementations, every drive adapter in the storage array can access every managed drive 201.

Data associated with host application instances 203 running on the hosts is maintained on the managed drives 201. The managed drives 201 are not discoverable by the hosts but the storage array creates a logical storage device 240 that can be discovered and accessed by the hosts. Without limitation, the logical storage device 240 may be referred to as a storage object, source device, production volume, production device, or production LUN, where the logical unit number (LUN) is a number used to identify logical storage volumes in accordance with the small computer system interface (SCSI) protocol. From the perspective of the hosts, the logical storage device 240 is a single drive having a set of contiguous fixed-size logical block addresses (LBAs) on which data used by the host application instances 203 resides. However, the host application data is stored at non-contiguous addresses on various managed drives 201. The compute nodes 212, 214 maintain metadata that maps between the logical storage device 240 and the managed drives 201 in order to process IOs from the hosts. The hosts maintain filesystems 230 that identify and describe data structures such as files, lists, arrays, stacks, queues, and trees within the host application data. IO commands sent from the hosts to the storage array reference LBAs of the logical storage device 240 rather than data structures because the storage array does not have access to the filesystems and is therefore unaware of the data structures in the data. Consequently, the recommendation engine 104 and data model 108 characterize and process blocks of the data without reference to, or use of, the data structures described by the filesystems 230. Recommendations generated by the recommendation engine are provided to the compute nodes and may be forwarded to the hosts. The recommendations may be interpreted as hints or commands depending on the implementation.

Figure 2:
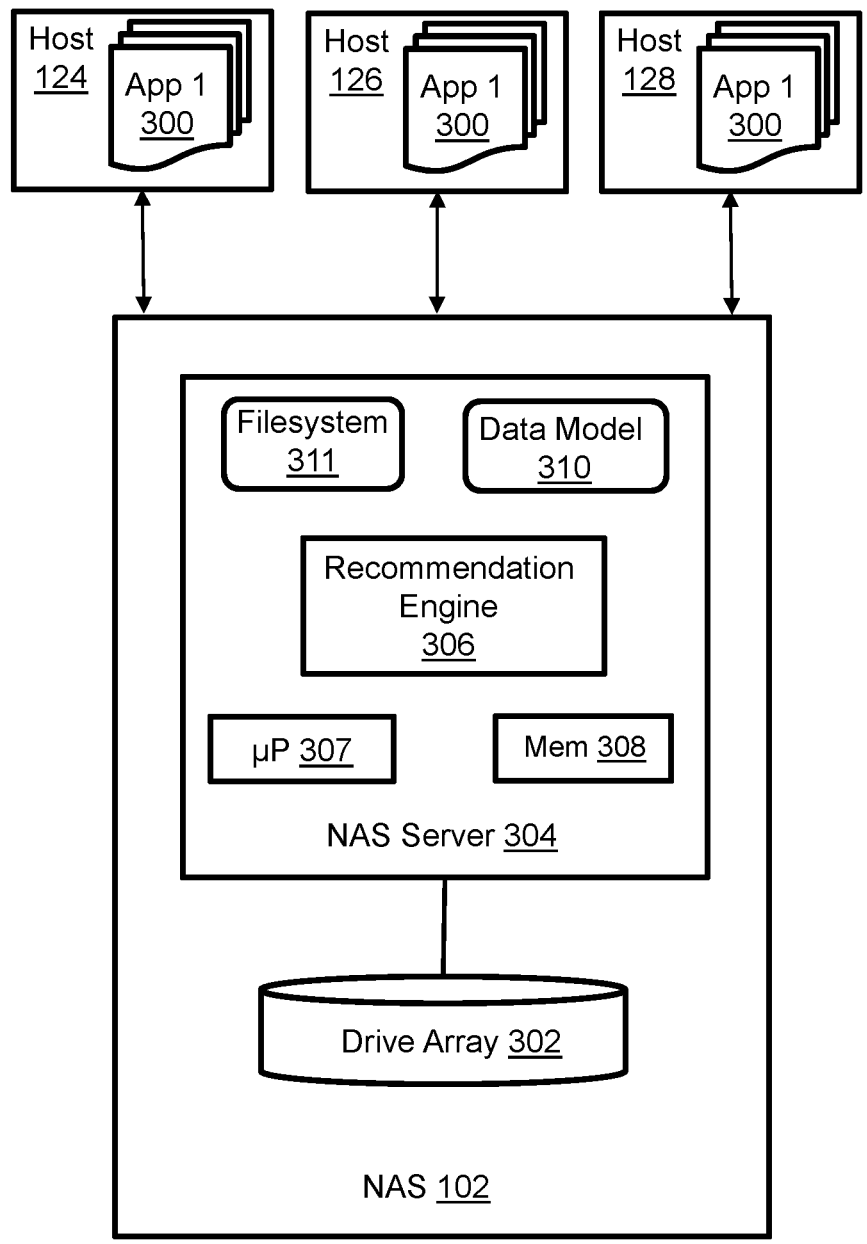
FIG. 2 illustrates a network-attached storage system with a recommendation engine that uses a data model to determine whether to compress binary data structures and to select compression algorithms to use with binary data structures that are compressed.

FIG. 2 illustrates a network-attached storage (NAS) system 102 with a recommendation engine 306 that uses a data model 310 to determine whether to compress binary data structures and to select compression algorithms to use with binary data structures that are compressed. Binary data structures may include files, lists, arrays, stacks, queues, and trees that are described by filesystem 311. The data model and recommendation engine can predict compressibility in general and relative compressibility by different compression algorithms using fewer processor cycles and less memory than would be required to perform compression with different compression algorithms, thereby improving the functioning of the NAS system.

NAS is a file-based storage system. Data associated with host application instances 300 running on the hosts 124, 126, 128 is maintained on a drive array 302. The hosts access the data by sending IOs to a NAS server 304 that manages access to the drive array. The NAS server includes at least one multi-core processor 307 and local memory 308. The processor may include CPUs, GPUs, or both. The local memory may include volatile media such as DRAM, NVM such as SCM, or both. The NAS server maintains a filesystem 311 that identifies and describes data structures such as files, lists, arrays, stacks, queues, and trees within the host application data stored on the drive array. Consequently, the recommendation engine 306 and data model 310 characterize and process stored data with reference to and use of data structures. The recommendations, which may be implemented by the NAS server or hosts, may be interpreted as hints or commands depending on the implementation.

Figure 3:
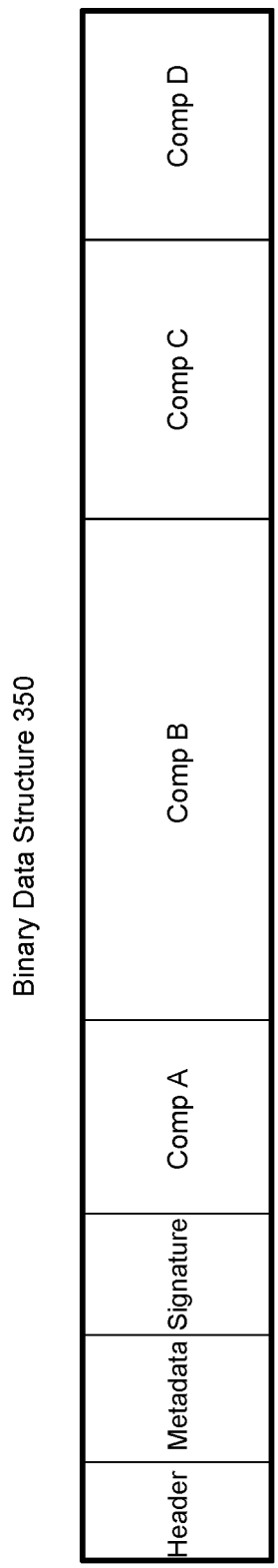
FIG. 3 illustrates a binary data structure.

FIG. 3 illustrates a binary data structure 350. Binary data structures ("binaries") are characterized by a binary format that is computer-readable but not human-readable. Examples of binaries include, but are not limited to, executables such as .exe and .dll files, images such as .jpg, .png, .gif, and .tiff files, video such as .mp4, .mkv, .mov, and .avi files, audio such as .mp3 and .mka files, documents such as .pdf, .doc. .xl, .ppt, and .docx files, and databases such as .mdb and .sqlite files. Binaries have a predetermined format that is adapted for use by a particular program, application, or hardware. For example, .doc files have a predetermined format that is adapted for use by word processing programs. A typical binary has a header, metadata, signature ("magic number"), encoding, and multiple components. The components may be linked, and each serves a different purpose during the use of the binary. An example of the different components of an executable file could be text, bss, code, heap, and stack. Components of a video file might include size, containers, streams, codecs, bitrate, and frames. Components of an image object might include MIME type, image size, pixel size, focal length, ISO speed, quality, resolution, and thumbnail. The illustrated binary data structure includes four generic components designated as Comp A, Comp B, Comp C, and Comp D. Within a given binary type the individual components vary in size and entropy.

Compression efficiency can be defined as a function of one or more of the times required to compress/decompress data, compression ratio, and memory requirements. Not all binaries of a given type compress with equal efficiency. For example, not all .docx files compress at the same ratio, and different .docx files may compress at higher ratios with different compression algorithms. Consequently, an optimal compression algorithm cannot reasonably be determined based on binary type alone. However, the components of a binary can be used to predict compressibility. Entropy is a measure of disorder that may be calculated using well-documented techniques. The entropy of components correlates with binary data structure compressibility. In general, binary compressibility is a function of the mean, median, mode, standard deviation, skewness, and kurtosis of the components. Consequently, component entropy can be used to predict the compressibility of a binary. Predicted compressibility may be compared with a predetermined threshold to determine whether it is worthwhile to compress the binary. Component size is a reliable indicator of binary compressibility with different compression algorithms. Consequently, component size can be used to select a compression algorithm that will most efficiently compress a binary that is sufficiently compressible to justify compression.

Due to the considerable variation of binary formats and the complex relationships between components and compression it may be impractical to reliably determine binary compressibility and select the most efficient compression algorithm using a simple algorithm. However, a machine learning technique can be used to determine whether to compress a binary and select a compression algorithm for compression of a binary that is to be compressed. Examples of suitable machine learning techniques may include but are not limited to neural networks, random forests, and K nearest neighbors.

Figure 4:
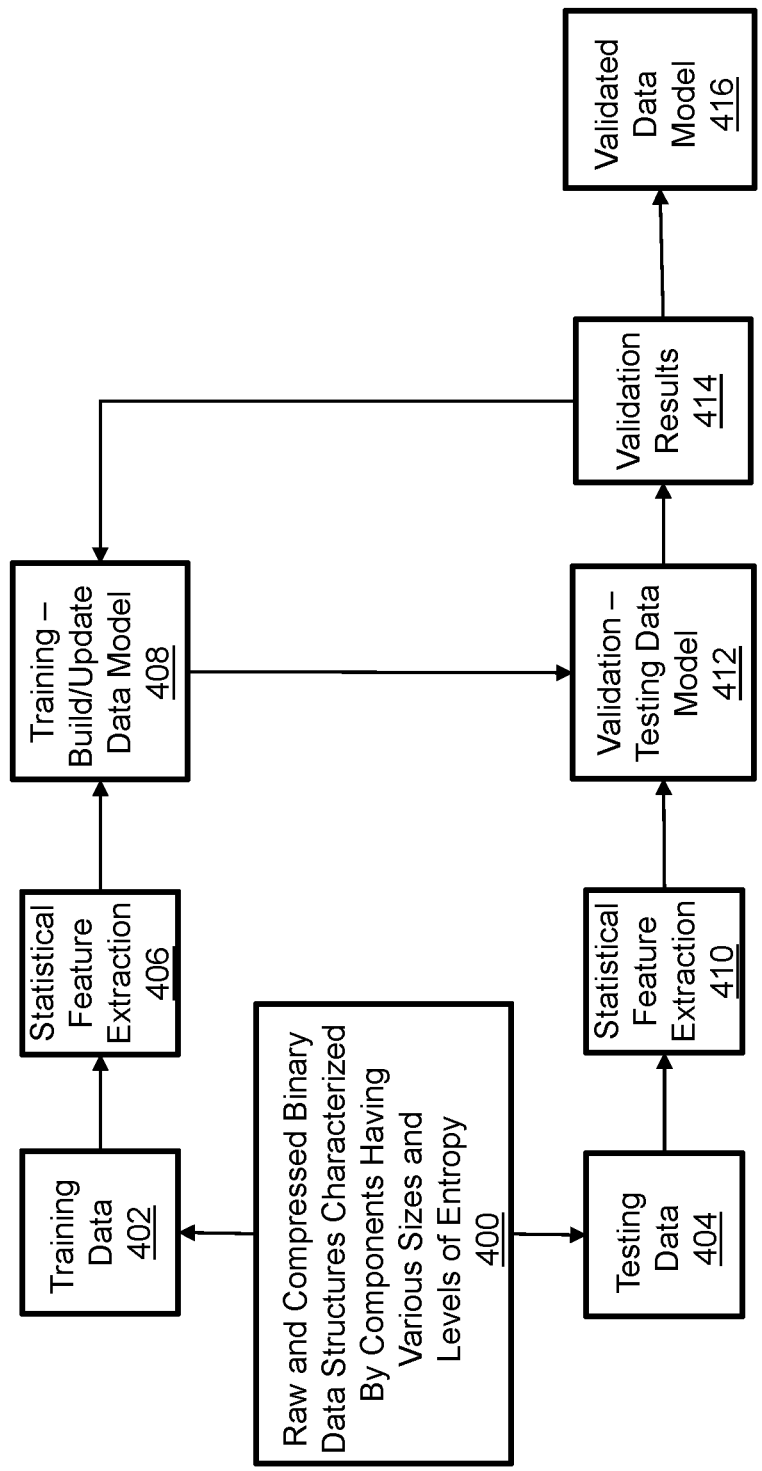
FIG. 4 illustrates the generation of a data model.

FIG. 4 illustrates the generation of a machine learning data model such as the SAN data model 108 (FIG. 1) and the NAS data model 310 (FIG. 2). A dataset 400 that includes raw (uncompressed and unencrypted) and compressed binary data structures characterized by components having various sizes and levels of entropy is used to generate the data model. The raw and compressed binary data structures may include a variety of types of binaries, e.g. executable files, image files, audio files, video files, lists, arrays, stacks, queues, and trees, each of different types, and each of which includes instances with components having various sizes and levels of entropy. Further, the compressed data in dataset 400 may include binaries that have been compressed using a variety of compression algorithms. The identities of the compression algorithms may be known and associated with the respective compressed binaries. The compressed binaries may be compressed forms of the raw binaries. The binaries may be selected or created with components characterized by ranges of entropy and size calculated to encompass the ranges of component entropy and size of host application data that will be processed by the data model.

The dataset 400 is divided into training data 402 and testing data 404. Features are extracted from the training data in step 406. The extracted features include the components of the binaries and one or more of the following statistical features of the components: size, mean, median, mode, standard deviation, skewness, and kurtosis. Mean, median, mode, and standard deviation are well-understood in the art and may be calculated using well-documented techniques. Skewness is a measure of lack of symmetry that may be calculated using well-documented techniques. Kurtosis is a measure of whether data is heavy-tailed or light-tailed relative to a normal distribution that may be calculated using well-documented techniques. The extracted features are used in training step 408 to build a data model. The data model predicts binary compressibility as a function of component entropy based on the statistical features and compression efficiency with various compression algorithms based on component sizes. The same statistical features are extracted from the testing data 404 in step 410. The extracted features are used in validation step 412 to test the data model. If the validation results 414 indicate that the data model is not yet properly trained, then the data model is updated and further trained in step 408. If the validation results indicate that the data model is properly trained, then the data model is outputted as a validated data model 416. A properly trained data model can predict the compressibility of binary types included in the training data with a predetermined level of accuracy. Further, a properly trained data model can predict with a predetermined level of accuracy which compression algorithm included in the training data will most efficiently compress the binary.

Figure 5:
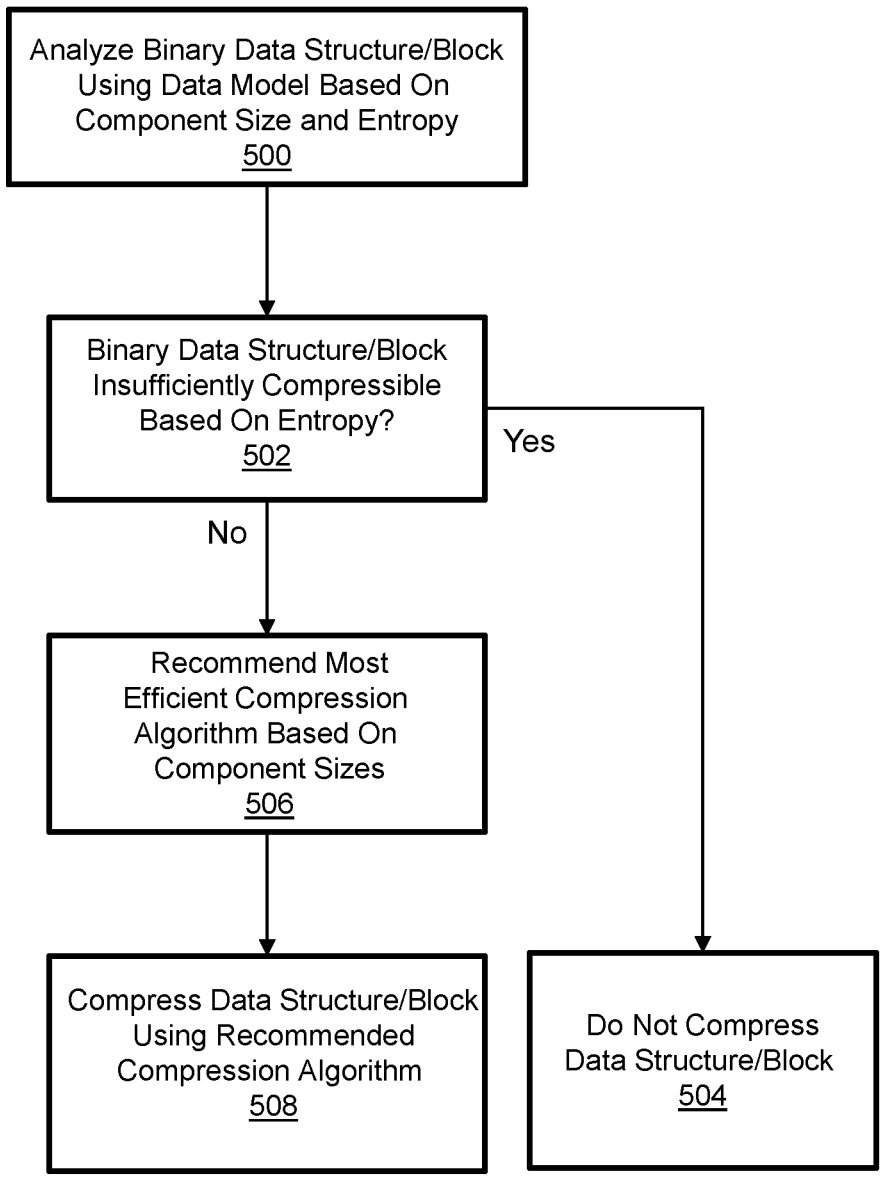
FIG. 5 illustrates the operation of the recommendation engines.

FIG. 5 illustrates the operation of the recommendation engines (104, FIGS. 1 and 306, FIG. 2). Step 500 is using the validated data model to analyze a binary data structure or block of binary data. A NAS system may analyze a binary data structure because the NAS filesystem enables the NAS server to identify those data structures. In contrast, the SAN does not recognize individual data structures in the binary data and would therefore analyze a block of data. The blocks that are analyzed by the SAN recommendation engine are fixed-size allocation units. The block size used for the data analysis is not necessarily the same as the block size used by the managed drives or the block size associated with the logical devices. Features are extracted from the binary data structure or block in step 500. The same features used for the generation of the data model are extracted. The extracted features are used by the recommendation engine with the data model to generate characterizations of the binary data structure or block. Each characterization indicates the compressibility of the data structure or block and which compression algorithm will most efficiently compress the data structure or block. The characterizations are used in subsequent steps to generate recommendations. Step 502 is deciding how to proceed with an analyzed data structure or block based on the compressibility predicted based on component entropy. For example, compressibility in terms of compression ratio, space saved, or some other measure may be compared with a predetermined threshold. If the binary data structure or block is determined to be insufficiently compressible in step 502 then a decision or recommendation is made to not compress the data structure or block as indicated in step 504. If the binary data structure or block is determined to be sufficiently compressible in step 502 then a decision or recommendation is made to compress the data structure or block with the compression algorithm that will most efficiently compress that data structure or block as indicated in step 506. The compression algorithm that will most efficiently compress the data structure or block is selected based on component sizes. The data structure or block is then compressed with that compression algorithm as indicated in step 508.

Specific examples have been presented to provide context and convey inventive concepts. The specific examples are not to be considered as limiting. A wide variety of modifications may be made without departing from the scope of the inventive concepts described herein. Moreover, the features, aspects, and implementations described herein may be combined in any technically possible way. Accordingly, modifications and combinations are within the scope of the following claims.

What is claimed is:

1. An apparatus comprising:
    at least one compute node that manages access to non-volatile storage, the compute node configured to respond to commands from host nodes to access host application data stored on the non-volatile storage, wherein the host application data comprises binary data;
    a data model that has been trained to predict compression efficiency of binary data structures by a plurality of data compression algorithms based on sizes of components of the binary data structures, where each of the binary data structures comprises a header, metadata, signature, encoding, and a plurality of the components; and
    a recommendation engine that uses the data model to determine which one of the plurality of data compression algorithms will most efficiently compress selected binary data and recommends that compression algorithm;
    wherein the compute node compresses the selected binary data using the recommended compression algorithm.

2. The apparatus of claim 1 wherein the data model that has been trained to predict compressibility of the binary data structures based on component entropy, and wherein the recommendation engine uses the data model to determine whether the selected binary data is sufficiently compressible to justify compression.

3. The apparatus of claim 1 wherein the selected binary data is a binary data structure selected from the group consisting of: executable files, image files, audio files, video files, lists, arrays, stacks, queues, and trees.

4. The apparatus of claim 1 wherein the selected binary data is a block comprising at least a portion of a binary data structure selected from the group consisting of: executable files, image files, audio files, and video files.

5. The apparatus of claim 1 wherein the recommendation engine uses the data model to identify the recommended compression algorithm based on predicted compression ratio of the selected binary data by each of the compression algorithms.

6. The apparatus of claim 2 wherein the data model is trained to predict compressibility using statistical features comprising: mean, median, mode, standard deviation, skewness, and kurtosis of binary data structure components.

7. The apparatus of claim 1 wherein the recommendation engine provides the recommendation to the compute node.

8. A method comprising:
    in a storage system comprising at least one compute node that manages access to non-volatile storage, the compute node configured to respond to commands from host nodes to access host application data stored on the non-volatile storage, wherein the host application data comprises binary data;
    predicting compression efficiency of selected binary data by a plurality of compression algorithms using a data model that has been trained to predict compression efficiency of binary data structures with the data compression algorithms based on sizes of components of the binary data structures, where each of the binary data structures comprises a header, metadata, signature, encoding, and a plurality of the components; and
    based on predicted compressibility, selecting one of the plurality of data compression algorithms that will most efficiently compress the selected binary data;
    recommending the selected compression algorithm; and
    compressing the selected binary data using the recommended compression algorithm.

9. The method of claim 8 wherein the data model that has been trained to predict compressibility of the binary data structures based on component entropy and comprising using the data model to determine whether the selected binary data is sufficiently compressible to justify compression.

10. The method of claim 8 comprising training the data model with binary data structures selected from the group consisting of: executable files, image files, audio files, and video files.

11. The method of claim 8 wherein predicting compression efficiency of the selected binary data comprising predicting compression efficiency of a block comprising at least a portion of one or more of: executable files, image files, audio files, and video files.

12. The method of claim 8 comprising using the data model to identify the recommended compression algorithm based on predicted compression ratio of the selected binary data with each of the compression algorithms.

13. The method of claim 9 comprising training the data model to predict compressibility using statistical features comprising: mean, median, mode, standard deviation, skewness, and kurtosis of binary data structure components.

14. The method of claim 8 comprising providing the recommendation to the compute node.

15. A computer-readable storage medium storing instructions that when executed by a compute node cause a storage system to perform a method for data compression, the method comprising:
    predicting compression efficiency of selected binary data by a plurality of compression algorithms using a data model that has been trained to predict compression efficiency of binary data structures by the data compression algorithms based on sizes of components of the binary data structures, where each of the binary data structures comprises a header, metadata, signature, encoding, and a plurality of the components; and
    based on predicted compression efficiency, selecting one of the plurality of data compression algorithms that will most efficiently compress the selected binary data;
    recommending the selected compression algorithm; and
    compressing the selected binary data using the recommended compression algorithm.

16. The computer-readable storage medium of claim 15 wherein the data model has been trained to predict compressibility of binary data structures based on component entropy and the method comprises using the data model to determine whether the selected binary data is sufficiently compressible to justify compression.

17. The computer-readable storage medium of claim 15 wherein the method comprises training the data mode with binary data structures selected from the group consisting of: executable files, image files, audio files, and video files.

18. The computer-readable storage medium of claim 15 wherein predicting compression efficiency of the selected binary data comprises predicting compression efficiency of a block comprising at least a portion of one or more of: executable files, image files, audio files, video files, lists, arrays, stacks, queues, and trees.

19. The computer-readable storage medium of claim 15 comprising using the data model to identify the recommended compression algorithm based on predicted compression ratio of the selected binary data by each of the compression algorithms.

20. The computer-readable storage medium of claim 16 comprising training the data model to predict compressibility using statistical features comprising: mean, median, mode, standard deviation, skewness, and kurtosis of binary data structure components.

* * * * *